United States Patent
Yoshino et al.

(10) Patent No.: US 10,138,570 B2
(45) Date of Patent: Nov. 27, 2018

(54) SYSTEM AND METHOD FOR PRODUCING GROUP 13 NITRIDE CRYSTALS COMPRISED OF GROWTH VESSELS STACKED WITHIN INNER VESSELS PLACED OVER SUPPORT TABLES WITH A CENTRAL ROTATING SHAFT AND REVOLVING SHAFTS ATTACHED TO THE SUPPORT TABLES

(71) Applicant: NGK INSULATORS, LTD., Nagoya, Aichi-prefecture (JP)

(72) Inventors: Takashi Yoshino, Ama (JP); Katsuhiro Imai, Nagoya (JP); Takanao Shimodaira, Nagoya (JP); Takashi Wada, Aichi-pref. (JP)

(73) Assignee: NGK INSULATORS, LTD., Aichi-prefecture (JP)

( * ) Notice: Subject to any disclaimer, the term of this patent is extended or adjusted under 35 U.S.C. 154(b) by 0 days.

(21) Appl. No.: 15/604,819

(22) Filed: May 25, 2017

(65) Prior Publication Data
US 2017/0260644 A1    Sep. 14, 2017

Related U.S. Application Data

(63) Continuation of application No. PCT/JP2015/078526, filed on Oct. 7, 2015.
(Continued)

(51) Int. Cl.
*C30B 9/12* (2006.01)
*C30B 9/00* (2006.01)
(Continued)

(52) U.S. Cl.
CPC .................. *C30B 9/00* (2013.01); *C30B 9/06* (2013.01); *C30B 9/12* (2013.01); *C30B 29/403* (2013.01); *C30B 29/406* (2013.01)

(58) Field of Classification Search
CPC .... C30B 9/00; C30B 9/04; C30B 9/08; C30B 9/10; C30B 9/12; C30B 19/00;
(Continued)

(56) References Cited

U.S. PATENT DOCUMENTS

| | | | |
|---|---|---|---|
| 2002/0108559 A1* | 8/2002 | Iwane | C30B 19/02 117/54 |
| 2009/0078193 A1 | 3/2009 | Imai et al. | |

(Continued)

FOREIGN PATENT DOCUMENTS

| | | |
|---|---|---|
| JP | 2009-012986 A | 1/2009 |
| JP | 2010-042976 A | 2/2010 |

(Continued)

OTHER PUBLICATIONS

International Search Report and Written Opinion for PCT Patent App. No. PCT/JP2015/078526 (dated Nov. 10, 2015) with English translation of the ISR.

(Continued)

*Primary Examiner* — Kenneth A Bratland, Jr.
(74) *Attorney, Agent, or Firm* — Cermak Nakajima & McGowan LLP; Tomoko Nakajima

(57) ABSTRACT

A crystal growth apparatus includes a pressure-resistant vessel; a plurality of support tables arranged inside the pressure-resistant vessel; inner vessels each placed over the support tables, respectively; growth vessels contained the inner vessels, respectively; a heating means for heating the growth vessels; and a central rotating shaft connected to the support tables. The central rotating shaft is distant from central axes of the inner vessels, respectively. A seed crystal, a raw material of the Group 13 element and a flux are charged in each of the growth vessels, and the growth vessels are heated to form a melt and a nitrogen-containing gas is supplied to the melt to grow a crystal of a nitride of (Continued)

said Group 13 element while the central rotating shaft is rotated.

6 Claims, 4 Drawing Sheets

Related U.S. Application Data

(60) Provisional application No. 62/084,728, filed on Nov. 26, 2014.

(51) Int. Cl.
*C30B 29/40* (2006.01)
*C30B 9/06* (2006.01)

(58) Field of Classification Search
CPC ......... C30B 19/02; C30B 19/06; C30B 29/00; C30B 29/10; C30B 29/40; C30B 29/403; C30B 29/406; Y10T 117/00; Y10T 117/10; Y10T 117/1024; Y10T 117/1096
USPC ..... 117/11, 54, 64, 67, 73, 76–79, 200, 206, 117/224, 937, 952
See application file for complete search history.

(56) References Cited

U.S. PATENT DOCUMENTS

| 2010/0260656 | A1 | 10/2010 | Minemoto et al. |
| 2011/0100292 | A1 | 5/2011 | Uematsu et al. |
| 2011/0274609 | A1 | 11/2011 | Shimodaira et al. |
| 2014/0197420 | A1* | 7/2014 | Iwai .................. C30B 19/02 257/76 |

FOREIGN PATENT DOCUMENTS

| JP | 2011-178626 A | 9/2011 | |
| JP | 5607548 B2 | 9/2014 | |
| WO | WO2007/122867 A1 | 11/2007 | |
| WO | WO2009/072254 A1 | 6/2009 | |
| WO | WO 2013/022122 A1 | 2/2013 | |
| WO | WO-2013022122 A1 * | 2/2013 | ............. C30B 19/02 |

OTHER PUBLICATIONS

International Preliminary Report on Patentability for PCT Patent App. No. PCT/JP2015/078526 (dated Jun. 8, 2017).

* cited by examiner

SYSTEM AND METHOD FOR PRODUCING GROUP 13 NITRIDE CRYSTALS COMPRISED OF GROWTH VESSELS STACKED WITHIN INNER VESSELS PLACED OVER SUPPORT TABLES WITH A CENTRAL ROTATING SHAFT AND REVOLVING SHAFTS ATTACHED TO THE SUPPORT TABLES

TECHNICAL FIELD

The present invention relates to a method and apparatus for producing a Group 13 element nitride crystal.

BACKGROUND ARTS

The flux method is one of liquid phase methods. For gallium nitride, the use of sodium metal as a flux can lower the temperature and pressure, which are required for the crystal growth of gallium nitride, to about 800° C. and several MPa. Specifically, nitrogen gas is dissolved in a mixed melt of sodium metal and gallium metal to bring gallium nitride into a supersaturated state, so that gallium nitride grows as crystals. In such liquid phase method, dislocation hardly occurs compared with vapor phase methods, thereby allowing to obtain high-quality gallium nitride having a low dislocation density (Patent document 1 (JP 2009-012986 A)).

The present applicant disclosed in Patent document 2 (JP 5607548 B2) a crystal growth apparatus suitable for the mass production of Group 13 element nitrides using the flux method. In this apparatus, a pressure-resistant vessel connected to a nitrogen gas pipe is provided with a heating space in its inside. A inner vessel is placed over a turntable arranged inside the heating space. Further, the inner vessel is provided with a nitrogen gas inlet port that is not connected to the nitrogen gas pipe installed to the pressure-resistant vessel. The inner vessel having such a configuration is configured to rotate during the growth of crystals to achieve an improvement in crystal quality.

CITATION LIST

PATENT DOCUMENT 1: JP 2009-012986 A
PATENT DOCUMENT 2: JP 5607548 B2

SUMMARY OF THE INVENTION

After implementing and further studying the invention described in Patent document 2, the present inventor found the following problem. Specifically, when the crystals are grown in a growth vessel arranged inside the inner vessel, a growth rate of the crystals is relatively higher on an outer peripheral side of the growth vessel, causing an inclusion in the crystals. The term "inclusion" refers to a heterogeneous phase generated in the crystals, which is derived from components in the melt.

On the other hand, the quality of crystals grown at a central part of the growth vessel is deteriorated and such crystals tends to have many dislocations. Further, the crystals grown at the center part of the growth vessel tends to be adhered with many undesirable crystals.

An object of the present invention is, in placing a growth vessel in an inner vessel, forming a melt in the growth vessel and supplying a nitrogen-containing gas into the growth vessel to grow a nitride of a group 13 element while rotating the inner vessel, to reduce a difference in quality between crystals in a central part and an outer peripheral part of the growth vessel.

The present invention provides a crystal growth apparatus comprising:

a pressure-resistant vessel;
a plurality of support tables arranged inside said pressure-resistant vessel;
inner vessels placed over said support tables, respectively;
growth vessels contained in said inner vessels, respectively;
a heating means for heating said growth vessels; and
a central rotating shaft connected to said support tables, said central rotating shaft being distant from central axes of said inner vessels, respectively,
wherein a seed crystal, a raw material of a Group 13 element and a flux are charged in each of said growth vessels, and wherein said growth vessels are heated to form a melt and a nitrogen-containing gas is supplied to said melt to grow a crystal of a nitride of said Group 13 element while said central rotating shaft is rotated.

The present inventor engaged in studies of Patent document 2 and obtained the following findings. In brief, in the apparatus of Patent document 2, the growth vessel is housed in the inner vessel and the crystals are grown while the inner vessel is rotated. However, in this apparatus, the central axes of the inner vessel and the growth vessel arranged inside the inner vessel are substantially aligned with their revolving shafts. In this configuration, the circumferential speed of the melt and the flow rate of the flux in the growth vessel become higher as going toward the outer peripheral side of the growth vessel, thus the growth rate of the crystals becomes higher on the outer peripheral side of the growth vessel and such crystals tend to have inclusions. On the other hand, the flow of the melt is stagnated around the rotation center of the growth vessel and the quality of the crystals grown around the rotation center of the growth vessel is deteriorated. Further, since the flow of the melt is stagnated around the rotation center of the growth vessel, undesirable crystals tend to form by spontaneous nucleation in the crystals grown around the rotation center. Further, when an additive, such as a dopant, is added to the inner vessel, anything that has a heavier specific density than the flux is moved to the outside of the inner vessel, while anything that has a lighter specific density than the flux is moved to near the center of the inner vessel by virtue of centrifugal force.

Regarding the above findings, the present inventor has reached the idea that the melt in the growth vessels are stirred by supporting the inner vessels placing the growth vessels by a plurality of support tables and rotating the plurality of the support tables and the inner vessels placed thereon by rotating a common central rotating shaft. As a result, the flow of the melt becomes uniform in each growth vessel, and the growth rates of the crystals between the outer peripheral side and the center part of each growth vessel become uniform. Furthermore, the flow of the melt is hardly stagnated.

EMBODIMENTS OF THE INVENTION

Figure 1:
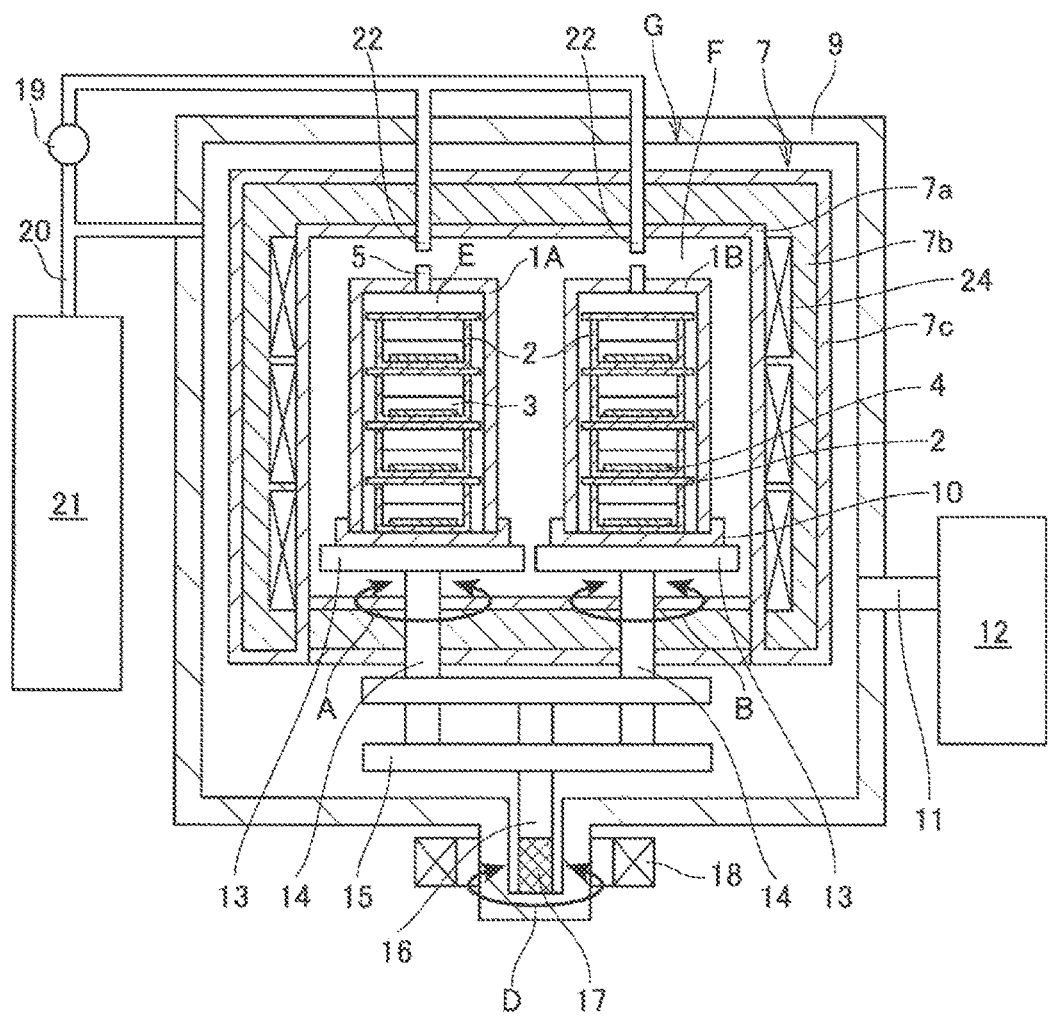
FIG. 1 is a schematic view illustrating a crystal growth apparatus according to an embodiment of the present invention.

As shown in FIG. 1, in a crystal growth apparatus according to an embodiment of the present invention, a heating vessel 7 is housed in an internal space G of a pressure-resistant vessel 9. The pressure-resistant vessel 9 is formed, for example, in a cylindrical shape having disc-shaped upper and lower surfaces. The heating vessel 7 comprises a heat insulating material 7b, a cover 7c that covers an external side of the heat insulating material, and a cover 7a that covers an internal side of the heat insulating material. Heaters 24 are arranged in a plurality of stages, for example, three stages, on a sidewall of the heating vessel 7, thereby enabling to control a temperature distribution in an internal space F of the heating vessel 7.

Further, the pressure-resistant vessel 9 is connected to a nitrogen gas pipe 20 from a nitrogen gas cylinder 21 as well as a vacuum suction pipe 11 from a vacuum pump 12. The nitrogen gas pipe 20 penetrates through the pressure-resistant vessel 9 and the heating vessel 7 and is opened to the internal space F of the heating vessel. The nitrogen gas pipe 20 is branched on its way and also opened to a space G between the pressure-resistant vessel 9 and the heating vessel. The heating vessel 7 is not completely sealed, however nitrogen gas is supplied to both an outside space and an inside space of the heating vessel in order to prevent a large pressure difference between the inside and the outside of the heating vessel. A branch pipe of the nitrogen gas pipe 20 leading to the internal space F of the heating vessel 7 is equipped with a mass flow controller 19 capable of adjusting a flow rate.

The vacuum suction pipe 11 penetrates through the pressure-resistant vessel 9 and is opened to a space between the pressure-resistant vessel 9 and the heating vessel 7.

Figure 2:
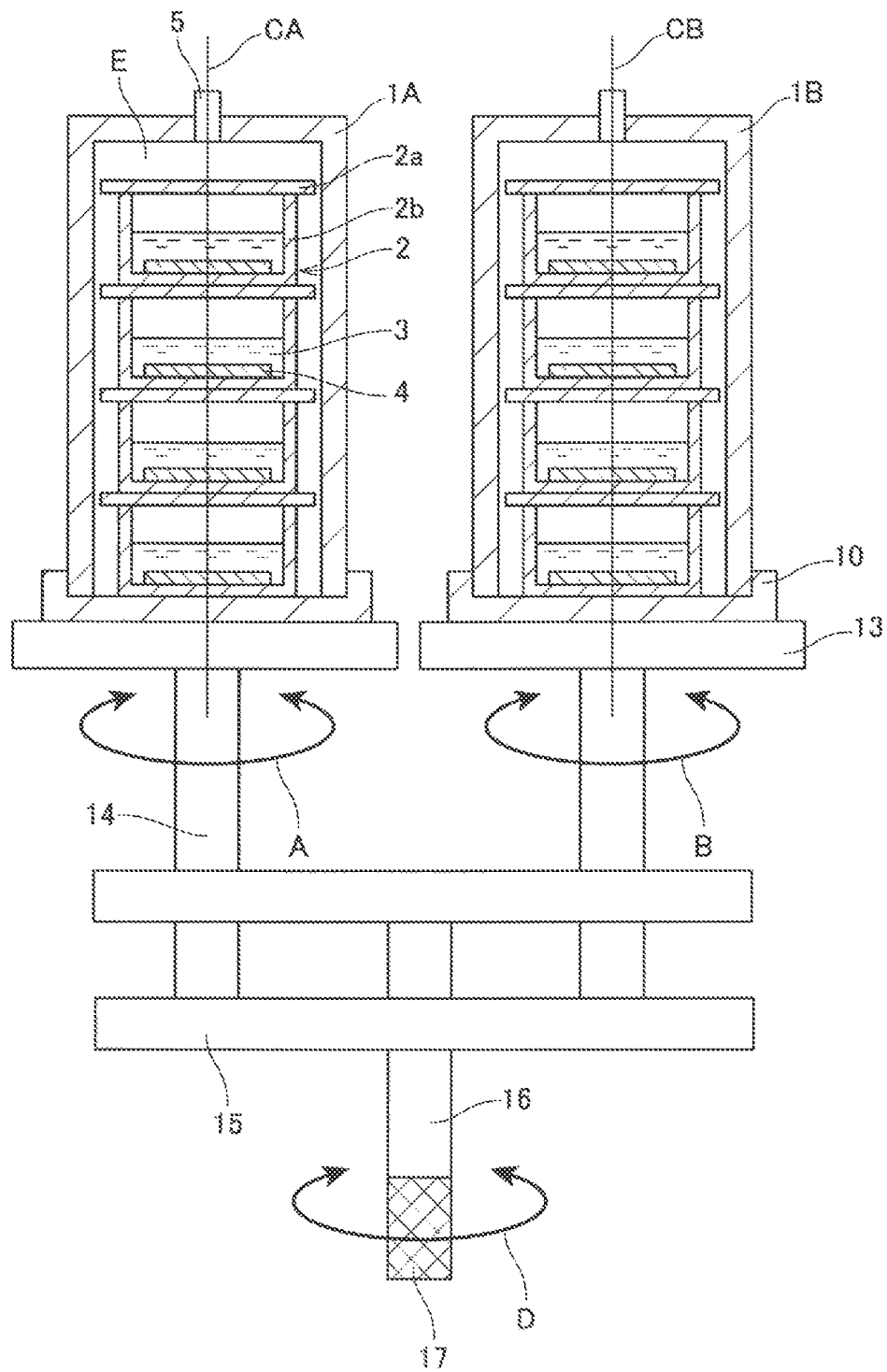
FIG. 2 is a schematic view illustrating growth vessels, inner vessels, support tables, and a rotation mechanism.

As mainly shown in FIG. 2, the apparatus has, for example, two inner vessels 1A and 1B each placing growth vessels 2. The number of the growth vessels housed in each inner vessel is not limited, however a plurality of the growth vessels are preferably housed in each inner vessel from the standpoint of productivity. Each growth vessel 2 comprises a body 2b and a lid 2a. During the growth of crystals, a melt 3 is formed in each growth vessel 2 and seed crystals 4 is immersed in the melt 3.

Inlet ports 5 of a nitrogen-containing gas are provided to the inner vessels 1A and 1B, respectively. Further, each of cradles 10 arranged under each inner vessel is supported by one of support tables 13 and revolving shafts 14. The revolving shafts 14 are each attached to a supporting structure 15 so as to be rotatable in directions of arrows A and B. Further, as shown in FIG. 1, each of the revolving shafts 14 penetrates through the heating vessel 7, and the supporting structure 15 is arranged between the heating vessel and the pressure-resistant vessel 9.

Further, the whole supporting structure 15 is attached to a central rotating shaft 16. The central rotating shaft is provided with an internal magnet 17. Further, a driving magnet 18 is provided outside the internal magnet 17, allowing each of the support tables 13 to rotate in directions of an arrow D.

During the growth of crystals, each growth vessel is supplied with the seed crystals 4 and materials of the melt 3. The materials of the melt 3 include a raw material of a Group 13 element, a flux, and optionally an additive and a trace substance.

The Group 13 element refers to a Group 13 element in the periodic table determined by IUPAC. Specific examples of the Group 13 element include gallium, aluminum, indium, thallium and the like. As a nitride of the Group 13 element, gallium nitride, aluminum nitride, and gallium aluminum nitride are particularly preferable. Further, examples of the additive include carbon, a metal having a low melting point (tin, bismuth, silver, and gold), and a metal having a high melting point (a transition metal such as iron, manganese, titanium, and chromium).

The seed crystals may constitute a self-standing body of the seed crystal or may be a seed crystal film formed on a supporting body.

When the seed crystal film is formed on the supporting body, although a single crystal substrate formed on the supporting body is not limited, examples thereof include sapphire, an AlN template, a GaN template, a GaN self-standing body, a silicon single crystal, a SiC single crystal, an MgO single crystal, spinel ($MgAl_2O_4$), $LiAlO_2$, $LiGaO_2$, a perovskite-type composite oxide, such as $LaAO_3$, $LaGaO_3$, and $NdGaO_3$, and SCAM ($ScAlMgO_4$). Also, it is possible to use a perovskite-type mixed oxide of a cubic crystal system represented by a composition formula $[A_{1-y}(Sr_{1-x}Ba_x)_y]$ $[(Al_{1-z}Ga_z)_{1-u}D]O_3$ (where A is a rare-earth element; D is one or more elements selected from the group consisting of niobium and tantalum; y=0.3 to 0.98; x=0 to 1; z=0 to 1; u=0.15 to 0.49; and x+z=0.1 to 2).

Although a production method of the seed crystals are not particularly limited, examples thereof include a vapor phase method such as a metal organic chemical vapor deposition (MOCVD) method, a hydride vapor phase epitaxy (HYPE) method, a pulse excited deposition (PXD) method, an MBE method, and a sublimation method, and a liquid phase method such as a flux method.

In a preferred embodiment, the Group 13 element nitride can be grown by the flux method. In this method, a type of a flux is not particularly limited as long as it can generate the Group 13 element nitride. In a preferred embodiment, a flux containing at least one of an alkali metal and an alkaline earth metal is used, and a flux containing sodium metal is particularly preferable.

As a raw material of the Group 13 element, simple metal, an alloy, or a metal compound may be used, although the simple metal of the Group 13 element is preferable from the standpoint of handling A ratio (molar ratio) of the Group 13 element/flux (e.g., sodium) in the melt is preferably high from the viewpoint of the present invention, and it is preferably 13 mol % or more, further preferably 18 mol % or more. However, when this ratio becomes too high, the crystal quality tends to be deteriorated. Thus, the ratio is preferably 40 mol % or less.

After the materials to be melted are supplied in the growth vessels, the growth vessels are put in the inner vessels, respectively. The inner vessels are then placed over the support tables 13, respectively. Next, the pressure-resistant vessel 9 is turned into vacuum state by driving the vacuum pump 12, and the nitrogen-containing gas is supplied into the pressure-resistant vessel 9 and the heating vessel 7 via the pipe 20 from the nitrogen gas-containing cylinder 21 to pressurize the insides of the pressure-resistant vessel 9 and the heating vessel 7. Then, under the pressurized atmosphere, the heating space F is heated at a prescribed temperature to form the melt. The nitrogen-containing gas is released into the internal space of the heating vessel from discharge ports 22 of the pipe 20, taken into the inner vessels from the inlet ports 5 attached to the inner vessels, and then supplied into the respective growth vessels.

Figure 3:
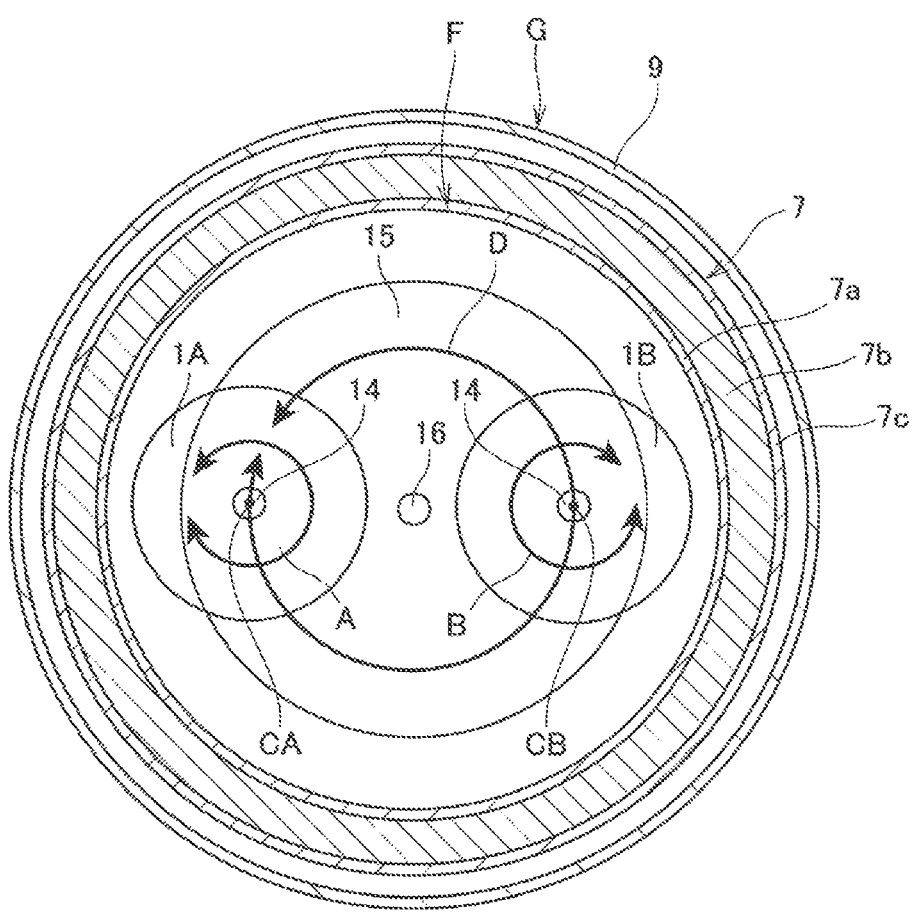
FIG. 3 is a schematic view illustrating a positional relationship among a pressure-resistant vessel, a heating vessel, inner vessels, a central rotating shaft, and rotational axes, when two inner vessels are provided.

In the present example, the central rotating shaft 16 is rotated as the arrow D, as shown in FIG. 1 and FIG. 3, at least during the growth of crystals. As a result, the supporting structure 15 rotates according to the rotation of the central rotating shaft 16, and the support tables 1A and 1B rotate around the central rotating shaft 16 as the arrow D. During this operation, central axes CA and CB of the inner vessels 1A and 1B are distant from the central rotating shaft 16, thus the inner vessels are configured to revolve around the central rotating shaft. As a result, the flow of the melt can be made uniform in the respective growth vessels present inside the inner vessels.

Further, in the present embodiment, the revolving shafts 14 are rotated as arrows A and B, respectively. As a result, the support tables 13 and the inner vessels 1A and 1B placed thereon are also revolved as the arrows A and B, respectively. In this manner, the inner vessels are configured to further rotate, which can additionally promote the stirring of the melt in the respective growth vessels and facilitate the growth of the nitride crystals.

Figure 4:
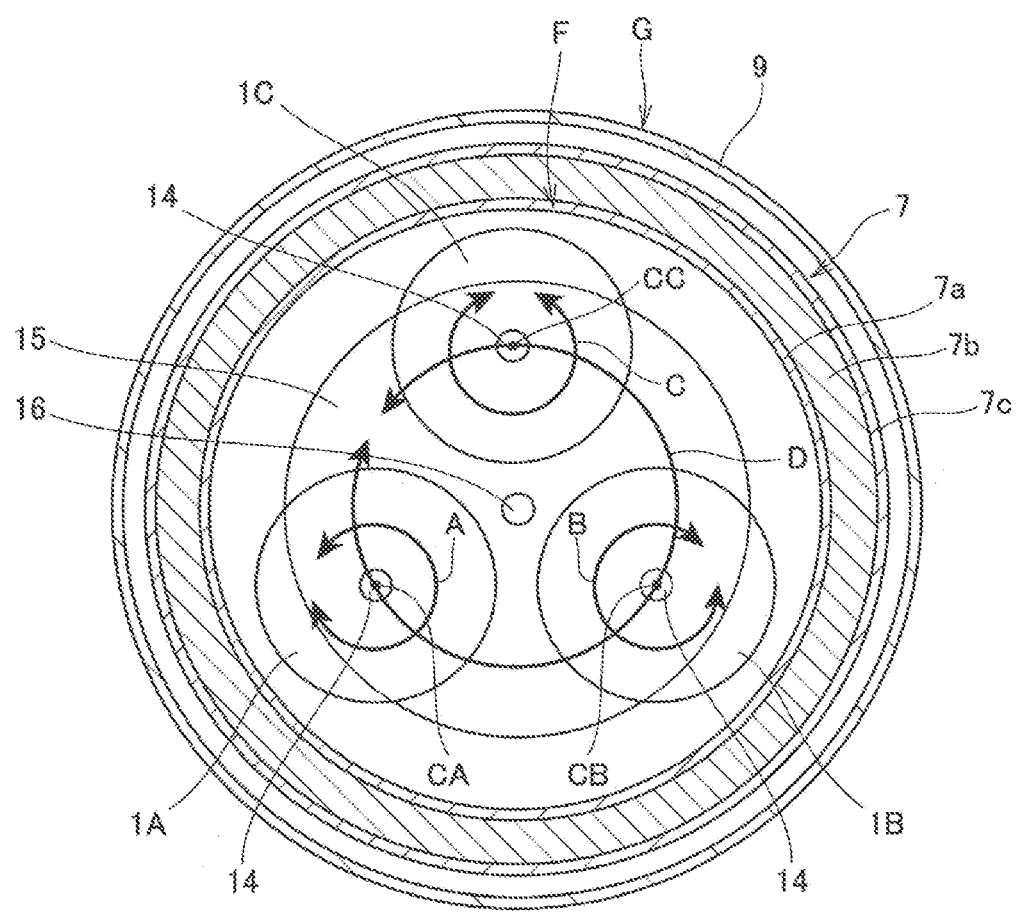
FIG. 4 is a schematic view illustrating a positional relationship among the pressure-resistant vessel, the heating vessel, the inner vessels, the central rotating shaft, and the rotational axes, when three inner vessels are provided.

Further, in the example shown in FIG. 4, three support tables 13 are provided and the inner vessels 1A, 1B, and 1C are each placed over one of the support tables 13. Then, the central rotating shaft 16 is rotated as the arrow D at least during the growth of crystals. As a result, the supporting structure 15 revolves according to the rotation of the central rotating shaft 16, and the support tables 1A, 1B, and 1C each rotate around the central rotating shaft 16 as the arrow D. During this operation, central axes of the inner vessels 1A, 1B and 1C are distant from the central rotating shaft 16, thus the inner vessels are configured to revolve around the central rotating shaft. As a result, the flow of the melt is made uniform in the respective growth vessels present inside the inner vessels.

Further, in the present embodiment, the revolving shafts 14 are rotated as arrows A, B, and C, respectively. As a result, the support tables 13 and the inner vessels 1A, 1B, and 1C placed thereon are also revolved as the arrows A, B, and C, respectively. In this manner, the inner vessels are configured to further revolve, which can additionally promote the stirring of the melt in the respective growth vessels and facilitate the growth of the nitride crystals.

In the present invention, the central rotating shaft and each rotating shaft can be independently and individually controlled. Further, the central rotating shaft and each rotating shaft can be rotated in the following manners.

(1) Rotated at constant speed.
(2) Changed in rotational speed.
(3) Reversed in rotational direction.
(4) After stopping rotation, resume rotation, in other words, rotated intermittently.
(5) Performing combination of (1) to (4) above.

The number of the support tables arranged inside the pressure-resistant vessel is not limited, but it is preferably two or more. Further, an upper limit of the number of the support tables is not particularly limited, but it is preferably eight or less.

The present invention comprises the central rotating shaft 16 connected to a plurality of the support tables, the central rotating shaft 16 being distant from the central axes CA, CB and CC of the inner vessels. Distances between the central rotating shaft and the central axes of the inner vessels are preferably 30 mm or more from the viewpoint of making the flow of the melt uniform in each inner vessel. Further, an upper limit of the distances between the central rotating shaft and the central axes of the inner vessels is not particularly limited and varies depending on the device scale.

Further, the distances between the central rotating shaft and the central axes of the inner vessels are preferably close to one another from the viewpoint of making the growth of the crystals uniform among the melt. Regarding this, a difference between a maximum value and a minimum value of the distances between the central rotating shaft and the central axes of the inner vessels is preferably 20 mm or less. It is particularly preferred that the distances between the central rotating shaft and the central axes of the inner vessels are equal to one another.

In a preferred embodiment, the central axes of the plurality of the inner vessels are arranged at positions having point symmetrical with respect to the central rotating shaft.

Further, in a preferred embodiment, for example, as shown in FIG. 1, the apparatus comprises the heating vessel 7 provided with the heating means 24. Such a heating vessel 7 is arranged inside the pressure-resistant vessel 9 and houses the plurality of the inner vessels.

The invention claimed is:

1. A crystal growth apparatus comprising:
a pressure-resistant vessel;
a plurality of support tables arranged inside said pressure-resistant vessel;
inner vessels placed over said support tables, respectively;
growth vessels contained in said inner vessels, respectively;
a heating means for heating said growth vessels;
a central rotating shaft connected to said support tables and revolving shafts attached to said support tables, respectively,
wherein said central rotating shaft is distant from central axes of said inner vessels,
wherein a seed crystal, a raw material of a Group 13 element and a flux are charged in each of said growth vessels, and wherein said growth vessels are heated to form a melt and a nitrogen-containing gas is supplied to said melt to grow a crystal of a nitride of said Group 13 element on said seed crystal while said central rotating shaft is rotated,
wherein said revolving shafts are configured to revolve while said crystal of said nitride of said Group 13 element is grown,
wherein distances between said revolving shafts and said central rotating shafts are equal to one another,
wherein said central axes of said inner vessels are arranged at positions which are point symmetrical with respect to said central rotating shaft, and
wherein said growth vessels are stacked in each of said inner vessels.

2. The apparatus of claim 1, wherein a number of said inner vessels is three or more.

3. The apparatus of claim 1 further comprising a heating vessel provided with said heating means, said heating vessel being arranged inside said pressure-resistant vessel and containing said inner vessels.

4. A crystal growth method of growing a crystal of a nitride of a Group 13 element, said method using a crystal growth apparatus, said crystal growth apparatus comprising:
a pressure-resistant vessel;
a plurality of support tables arranged inside said pressure-resistant vessel;
inner vessels placed over said support tables, respectively;

growth vessels contained in said inner vessels, respectively;

a heating means for heating said growth vessels;

a central rotating shaft connected to said support tables, and revolving shafts attached to said support tables, respectively, wherein said central rotating shaft is distant from central axes of said inner vessels, wherein said revolving shafts are configured to revolve while said crystal of said nitride of said Group 13 element is grown, wherein distances between said revolving shafts and said central rotating shaft are equal to one another, wherein said central axes of said inner vessels are arranged at positions which are point symmetrical with respect to said central rotating shaft, wherein said growth vessels are stacked in each of said inner vessels, the method comprising the steps of charging a seed crystal, a raw material of said Group 13 element and a flux in each of said growth vessels; and heating said growth vessels to form a melt and supplying a nitrogen-containing gas to said melt to grow said crystal of said nitride of said Group 13 element while said central rotating shaft is rotated.

5. The method of claim 4, wherein a number of said inner vessels is three or more.

6. The method of claim 4, wherein said apparatus further comprises a heating vessel provided with said heating means, said heating vessel being arranged inside said pressure-resistant vessel and containing said inner vessels.

* * * * *